US010305008B2

(12) United States Patent
Kawabata et al.

(10) Patent No.: US 10,305,008 B2
(45) Date of Patent: May 28, 2019

(54) SEMICONDUCTOR MODULE AND METHOD FOR MANUFACTURING THE SAME

(71) Applicant: Panasonic Intellectual Property Management Co., Ltd., Osaka (JP)

(72) Inventors: Takeshi Kawabata, Osaka (JP); Kiyomi Hagihara, Osaka (JP); Satoshi Kanai, Osaka (JP); Takashi Yui, Shiga (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/787,408

(22) Filed: Oct. 18, 2017

(65) Prior Publication Data
US 2018/0040792 A1 Feb. 8, 2018

Related U.S. Application Data

(63) Continuation of application No. PCT/JP2017/002639, filed on Jan. 26, 2017.

(30) Foreign Application Priority Data

Mar. 24, 2016 (JP) ................. 2016-060959

(51) Int. Cl.
*H01L 23/10* (2006.01)
*H01L 33/62* (2010.01)
(Continued)

(52) U.S. Cl.
CPC .............. *H01L 33/62* (2013.01); *H01L 23/40* (2013.01); *H01L 33/0095* (2013.01);
(Continued)

(58) Field of Classification Search
CPC . H01L 2224/32145; H01L 2224/48145; H01L 33/64; H01L 2225/06589
(Continued)

(56) References Cited

U.S. PATENT DOCUMENTS 5,790,384 A * 8/1998 Ahmad ............. H01L 23/49827
257/737
6,122,170 A * 9/2000 Hirose ................. C04B 37/026
174/16.3
(Continued)

FOREIGN PATENT DOCUMENTS

JP 2005-146035 A 6/2005
JP 2009-212367 A 9/2009
(Continued)

OTHER PUBLICATIONS

International Search Report and Written Opinion issued in International Patent Application No. PCT/JP2017/002639, dated Mar. 14, 2017; with partial English translation.

*Primary Examiner* — S. V. Clark
(74) *Attorney, Agent, or Firm* — McDermott Will & Emery LLP

(57) ABSTRACT

A semiconductor module includes: one or more semiconductor elements; a wiring substrate having a first surface on which the one or more semiconductor elements are mounted, the wiring substrate being electrically connected to the one or more semiconductor elements; a heat sink on which the wiring substrate is mounted, the heat sink facing a second surface of the wiring substrate on a reverse side of the first surface; a binder which is formed in a die pad area on the heat sink so as to be present between the wiring substrate and the heat sink, and bonds the wiring substrate and the heat sink; and a support which is formed in a peripheral part of the die pad area on the heat sink, and fixes (Continued)

the wiring substrate to the heat sink by being in contact with a peripheral part of the second surface of the wiring substrate.

21 Claims, 9 Drawing Sheets

(51) Int. Cl.
*H01L 23/40* (2006.01)
*H01L 33/64* (2010.01)
*H01L 33/00* (2010.01)
*H05K 7/20* (2006.01)
*H01L 25/075* (2006.01)

(52) U.S. Cl.
CPC ............ *H01L 33/64* (2013.01); *H01L 33/644* (2013.01); *H05K 7/20463* (2013.01); *H01L 25/0753* (2013.01); *H01L 2224/48091* (2013.01); *H01L 2924/181* (2013.01)

(58) Field of Classification Search
USPC .................................. 257/706, 707; 438/122
See application file for complete search history.

(56) References Cited

U.S. PATENT DOCUMENTS

| | | | | |
|---|---|---|---|---|
| 6,215,175 | B1* | 4/2001 | Kinsman | ........... H01L 23/49531 257/666 |
| 8,050,054 | B2* | 11/2011 | Chen | ...................... H01L 23/367 174/252 |
| 8,525,214 | B2* | 9/2013 | Lin | ....................... H01L 21/486 257/707 |
| 2013/0119431 | A1 | 5/2013 | Suzuki et al. | |
| 2016/0013168 | A1* | 1/2016 | Standing | ............... H01L 23/492 257/783 |

FOREIGN PATENT DOCUMENTS

| | | |
|---|---|---|
| JP | 2010-177404 A | 8/2010 |
| JP | 2012-080012 A | 4/2012 |
| JP | 2012-109521 A | 6/2012 |
| JP | 2012-212883 A | 11/2012 |
| JP | 2013-105929 A | 5/2013 |
| JP | 2014-093148 A | 5/2014 |

* cited by examiner (a)

(b)

(a)

(b)

(c)

(d)

(a)

(b)

(c)

SEMICONDUCTOR MODULE AND METHOD FOR MANUFACTURING THE SAME

CROSS REFERENCE TO RELATED APPLICATIONS

This application is a U.S. continuation application of PCT International Patent Application Number PCT/JP2017/002639 filed on Jan. 26, 2017, claiming the benefit of priority of Japanese Patent Application Number 2016-060959 filed on Mar. 24, 2016, the entire contents of which are hereby incorporated by reference.

BACKGROUND

1. Technical Field

The present disclosure relates to a semiconductor module and a method for manufacturing the semiconductor module.

2. Description of the Related Art

In recent years, light emitting diodes (LEDs) have become widely popular as optical elements which save power consumption and replace incandescent lamps and fluorescent lamps. Semiconductor packages having such semiconductor elements are being replaced with modules having not only semiconductor elements or semiconductor packages but also peripheral components because of demands for reducing the sizes of casing sets having the semiconductor elements or semiconductor packages housed therein and ease in creating electrical or optical designs of semiconductor elements or semiconductor packages.

In these circumstances, it is increasingly important for semiconductor modules to achieve high heat dissipation that supports high output by the semiconductor elements. Thus, semiconductor modules having a binder which provides a high thermal conductivity and a wiring substrate and a metal substrate which provide high heat dissipation have been developed (for example, see Japanese Unexamined Patent Application Publication No. 2012-109521 (PTL 1) and Japanese Unexamined Patent Application Publication No. 2013-105929 (PTL 2).

SUMMARY

However, with the above-described configuration, it is difficult to secure mounting accuracy on the X-Y plane and control the height along the Z axis when mounting and bonding a wiring substrate or a sub-mount having the semiconductor elements mounted thereon. In order to achieve the mounting accuracy (a height, a tilt, a swing, a position on the X-Y plane, etc.) required for optical elements etc., a mounting head tool needs to hold the sub-mount long time, which makes it difficult to mount the sub-mount in a short time.

In view of the above problem, the present disclosure has an object to provide a semiconductor module for mounting a wiring substrate or a sub-mount having one or more semiconductor elements mounted thereon onto a heat sink with high accuracy in a short time, and provide a method for manufacturing the semiconductor module.

In order to solve the above problems, a semiconductor module according to an aspect of the present disclosure is a semiconductor module including: one or more semiconductor elements; a wiring substrate having a first surface on which the one or more semiconductor elements are mounted, the wiring substrate being electrically connected to the one or more semiconductor elements; a heat sink on which the wiring substrate is mounted, the heat sink facing a second surface of the wiring substrate on a reverse side of the first surface; a binder which is formed in a die pad area on the heat sink so as to be present between the wiring substrate and the heat sink, and bonds the wiring substrate and the heat sink; and a support which is formed in a peripheral part of the die pad area on the heat sink, and fixes the wiring substrate to the heat sink by being in contact with a peripheral part of the second surface of the wiring substrate; wherein the binder and the support are formed apart from each other.

In addition, a semiconductor module manufacturing method according to an aspect of the present disclosure is a semiconductor module manufacturing method including: forming at least three supports independently on a heat sink; forming a binder on the heat sink so that the binder does not touch the at least three supports; disposing a wiring substrate on which one or more semiconductor elements are mounted so that the binder is present between the wiring substrate and the heat sink and across the at least three supports, and fixing the wiring substrate to the at least three supports; and heating and melting the binder to bond the wiring substrate and the heat sink, wherein, in the forming of a binder, the binder is disposed to be surrounded by the at least three supports in a plan view.

The semiconductor module and the method for manufacturing the semiconductor module according to the present disclosure make it possible to mount the wiring substrate or the sub-mount having the one or more semiconductor elements mounted thereon onto the heat sink with high accuracy in a short time.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

In FIG. 1, (a) is a cross-sectional view of the semiconductor module, and (b) is a perspective view of the same;

DETAILED DESCRIPTION OF THE EMBODIMENTS (Underlying Knowledge Forming Basis of the Present Disclosure)

Figure 12:
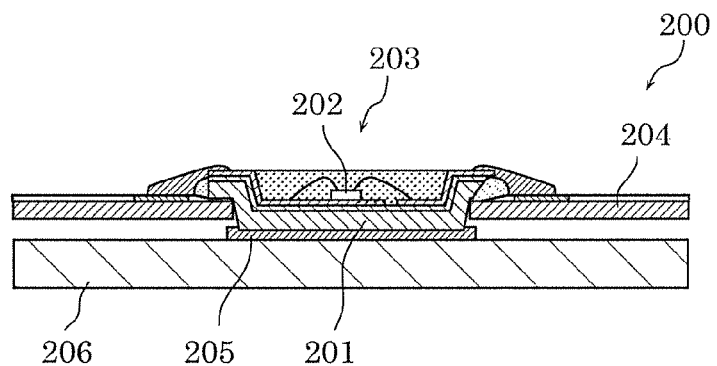
FIG. 12 shows a cross-sectional view of a first exemplary semiconductor module according to a conventional technique.

FIG. 12 illustrates a first exemplary semiconductor module according to a conventional technique. Semiconductor module 200 illustrated in FIG. 12 includes LED package substrate 201 on which LED chip 202 is mounted. Furthermore, LED package 203 is mounted on wiring substrate 204. Part immediately below LED package 203 is bonded to heat sink 206 by soldering or with binder 205 having a high thermal conductivity.

Figure 13:
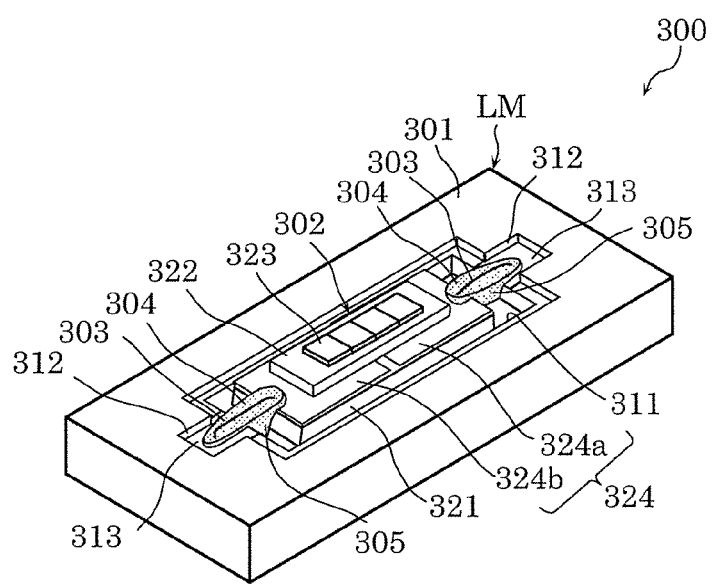
FIG. 13 shows a cross-sectional view of a second exemplary semiconductor module according to a conventional technique.

FIG. 13 illustrates a second exemplary semiconductor module according to a conventional technique. In semiconductor module 300 illustrated in FIG. 13, each of LED elements 323 are electrically connected to positive electrode land 324a and negative electrode land 324b of heat sink 321 via sub-mount 322 which is a mount structure including a mounted wiring substrate, and sub-mount 322 is mounted on the upper surface of heat sink 321.

However, the above configuration makes it difficult to secure mounting accuracy on the X-Y plane and control the height along the Z axis when mounting or bonding the wiring substrate or the sub-mount having LED elements 323 mounted thereon onto heat sink 321. This is explained below in detail.

In a semiconductor module including: a plurality of semiconductor elements; a wiring substrate or a sub-mount on which the plurality of semiconductor elements are mounted; a heat sink on which the wiring substrate is mounted, optical centers are determined with respect to the optical positions of the respective semiconductor elements. The semiconductor module is mounted on a casing using reference holes in the heat sink as references. Accordingly, mounting components onto the semiconductor module requires high mounting accuracy with respect to the optical centers and the positions of the reference holes in the heat sink. As a result, bonding with the wiring substrate or the heat sink of the sub-mount requires a highly-accurate positioning between them.

In the above configuration, for example in the sub-mount mounting method disclosed in Patent Literature 2 (PTL 2), heat sink 321 is heated first, and then a binder (die bond material) is placed on heat sink 321 and is heated to be melted. Sub-mount 322 is then picked up by a mounting head tool and is mounted on the binder. At this time, in order to secure the mounting accuracy on the X-Y plane and the height along the Z axis, the mounting head tool keeps holding sub-mount 322 until sub-mount 322 is disposed at a predetermined location. In sequence, sub-mount 322 is bonded with the binder, held, and cooled down to be solidified. Here, if sub-mount 322 is dissipated from the mounting head tool, it is impossible to control mounting accuracy such as height variation.

The generally-used heat sinks made of metal such as Cu take long time to be heated or cooled down to a desired temperature because of its high thermal capacity, which lengthens manufacturing cycle time. In addition, it is impossible to achieve the mounting accuracy (a height, a tilt, a swing, a position on the X-Y plane, etc. required for optical elements etc. without securing long time for a mounting head tool to hold a sub-mount. In other words, it is difficult to achieve the mounting accuracy while reducing the manufacturing cycle time.

Furthermore, if a metal binder having a high melting point is used, the metal binder itself needs to be heated to a high temperature to be melted. Thus, a long time is required for heating from and cooling down to a normal temperature, which lengthens the manufacturing cycle time. These problems are noticeable.

In view of this, descriptions are given of a semiconductor module for mounting a wiring substrate or a sub-mount having semiconductor elements mounted thereon onto a heat sink with high accuracy in a short time and a method for manufacturing the semiconductor module.

Hereinafter, embodiments and modifications and variations thereof are described in detail with reference to the drawings. It is to be noted that substantially the same constituent elements are given the same numerical references and descriptions thereof may be omitted in the embodiments etc. below. Each of the embodiments etc. below describes a specific example. The numerical values, shapes, materials, constituent elements, the arrangement and connection of the constituent elements, steps, the processing order of the steps etc. indicated in the following exemplary embodiments etc. are mere examples, and therefore do not limit the scope of the present disclosure. Among the constituent elements in the following embodiments etc., constituent elements not recited in any one of the independent claims are described as arbitrary constituent elements. It is to be noted that unnecessarily detailed descriptions may be omitted. For example, detailed descriptions of well-known matters and overlapping descriptions of substantially the same constituent elements may be omitted. This omission is made to prevent the following descriptions from being unnecessarily redundant and help the person skilled in the art appreciate the present disclosure.

It is to be noted that the attached drawings and the descriptions below are provided to help the person skilled in the art fully appreciate the present disclosure, and thus are not intended to limit the scope of the claims.

Each of cross-sectional views described in the embodiments below is a cross-sectional view along a straight line passing through two opposing supports arranged in the semiconductor module in each embodiment.

Embodiment 1

Hereinafter, Embodiment 1 is described with reference to FIG. 1.

Figure 1:
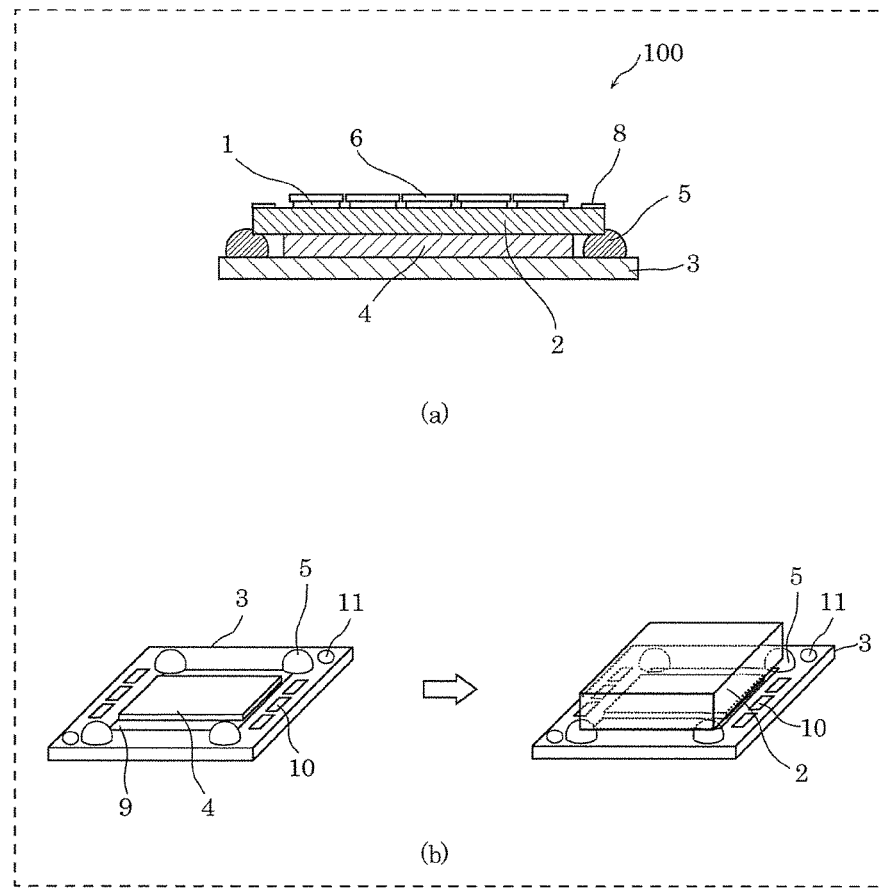
FIG. 1 is a schematic diagram illustrating a configuration of a semiconductor module according to Embodiment 1.

In FIG. 1, (a) is a schematic diagram (cross-sectional view) of a configuration of semiconductor module 100 according to this embodiment. In FIG. 1, (b) is a schematic diagram (perspective view) of a configuration of semiconductor module 100 according to this embodiment. It is to be noted that semiconductor elements 1, phosphors 6, and electrodes 8 illustrated in (a) of FIG. 1 are not illustrated in (b) of FIG. 1.

Semiconductor module 100 illustrated in (a) and (b) of FIG. 1 includes: a plurality of semiconductor elements 1; wiring substrate 2 which has a first surface on which semiconductor elements 1 are mounted and which is electrically connected to semiconductor elements 1; heat sink 3 on which wiring substrate 2 is mounted so as to face a second surface opposite to the first surface of wiring substrate 2; binder 4 which bonds wiring substrate 2 and heat sink 3; and a plurality of supports 5 which fix wiring substrate 2 on heat sink 3. Binder 4 is located to cover the projection surfaces of semiconductor elements 1 and has supports 5 around binder 4.

Semiconductor elements 1 are, for example, optical elements. Light-emitting elements such as LEDs and lasers are used as semiconductor elements 1. Semiconductor elements 1 are mounted on and electrically connected to wiring substrate 2. Wiring substrate 2 on which semiconductor elements 1 are mounted may be referred to as a sub-mount.

In order to secure optical characteristics, phosphors 6 cover the surfaces of semiconductor elements 1. Light from semiconductor elements 1 is emitted outward through phosphors 6.

Wiring substrate 2 has a plurality of semiconductor elements 1 mounted thereon. Another element for controlling light-emitting modes and brightness of the plurality of semiconductor elements 1 may also be mounted thereon.

Wiring substrate 2 is required to have a high heat dissipation to dissipate heat from semiconductor elements 1. Wiring substrate 2 is also required to have a linear expansion coefficient that is comparatively closer to that of semiconductor elements 1 in order to mount semiconductor elements 1 with high accuracy and secure reliability. Wiring substrate 2 is formed using an aluminum nitride or the like. Here, an organic substrate made of a ceramic material or a resin material other than the aluminum nitride can be used instead as long as the requirements in heat dissipation and linear expansion coefficient are satisfied.

In addition to the electrodes for connection with semiconductors 1, electrodes 8 for electrical connection with heat sink 3 are also formed on wiring substrate 2.

Heat sink 3 is generally formed using a metal material such as copper and aluminum. Heat sink 3 has a surface with die pad area 9 for connection with the second surface of wiring substrate 2 and electrodes 10 for electrical connection with electrodes 8 on wiring substrate 2. In addition, a finished product of semiconductor module 100 has reference holes 11 to be used as references when semiconductor module 100 is mounted onto an optical device. In general, reference holes 11 are aligned with reference holes in an optical device, and semiconductor module 100 is screw-fixed to the optical device.

Supports 5 and binder 4 are present between heat sink 3 and wiring substrate 2 and fix or bond heat sink 3 and wiring substrate 2. Supports 5 are preferably made of a resin or metal material such as an epoxy resin material. Supports 5 may be made of a metal material, specifically may be formed with metal bumps.

Supports 5 are provided for the purpose of provisionally fixing heat sink 3 in the process of mounting wiring substrate 2 onto heat sink 3 in order to maintain mounting accuracy. At least three supports 5 are formed separately on a surface of heat sink 3 so as to surround binder 4. Binder 4 is generally a die bond material having a high heat dissipation. A SnAgCu or AuSn soldering material or a material having a high metal filling rate such as Ag nano paste is used for binder 4. It is desirable for binder 4 to have a heat expansion which is between those of wiring substrate 2 and heat sink 3 in order to absorb the difference in heat expansion between wiring substrate 2 and heat sink 3 and secure reliability in bonding wiring substrate 2 and heat sink 3. For example, when wiring substrate 2 is made of an aluminum nitride and heat sink 3 is made of Cu, binder 4 having a line expansion of 7 to 14 ppm/k is desirable because the line expansion of the aluminum nitride is 4 to 5 ppm/k and the line expansion of Cu is 16 to 18 ppm/k.

In addition, it is desirable that binder 4 has a height of 20 to 70 μm after bonding wiring substrate 2 and heat sink 3 in terms of the balance between reliability and heat dissipation. A desired height is easy to maintain even after melting if a metal pellet is used as a material for binder 4. In addition, binder 4 is located immediately below semiconductor elements 1, and thus increases efficiency in heat dissipation to heat sink 3.

It is to be noted that heat sink 3 and wiring substrate 2 may be electrically connected by directly bonding electrodes 8 on wiring substrate 2 and electrodes 10 on heat sink 3 using a metal wire made of aluminum, Au, Cu, or the like, instead of using binder 4.

Subsequently, not-shown connectors, thermistors, chips, etc. are mounted on heat sink 3, and general solder mounting such as reflow heating is performed to manufacture a semiconductor module.

Semiconductor module 100 according to this embodiment is configured to allow supports to keep holding wiring substrate 2 and heat sink 3 in a provisionally fixed manner until wiring substrate 2 and heat sink 3 are bonded by binder 4. In this way, it is possible to prevent wiring substrate 2 and heat sink 3 from being misaligned and displaced toward the Z direction caused due to the difference in line expansion rate between the materials thereof. Furthermore, the configuration obviates the need to cause a mounting head tool to hold wiring substrate 2 long time from mounting to cooling down as in the conventional technique, which reduces the manufacturing cycle time.

In addition, as illustrated in the left part of (b) in FIG. 1, four supports 5 are arranged separately on a surface of heat sink 3 to surround binder 4. The number of supports 5 here is four but may be at least three. Here, as illustrated in the right part of (b) in FIG. 1, wiring substrate 2 is mounted on supports 5. At this time, it is possible to provisionally fix wiring substrate 2 and heat sink 3.

With the configuration, wiring substrate 2 is stably fixed on the surface of heat sink 3 via supports 5. Thus, it is possible to reduce tilt, displacement on the X-Y plane, etc of semiconductor elements 1 and wiring substrate 2 with respect to heat sink 3.

When supports 5 are made of a resin material in the case of (a) and (b) of FIG. 1, insulation from supports 5 made of a conductive material can be secured. Thus, it is possible to fix wiring substrate 2 and heat sink 3 under comparatively few restrictions in the positions of supports 5 between wiring substrate 2 and heat sink 3.

Modification 1 of Embodiment 1

Figure 2:
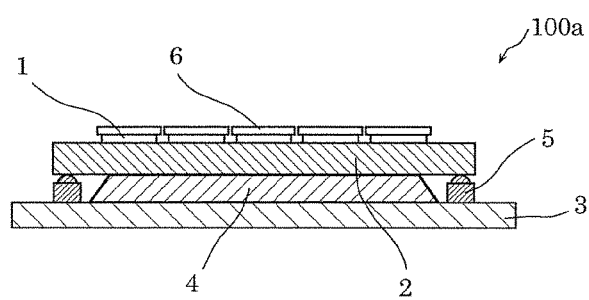
FIG. 2 shows a cross-sectional view of Modification 1 of the semiconductor module according to Embodiment 1.

FIG. 2 is a schematic cross-sectional view of a configuration of Modification 1 of semiconductor module 100 according to Embodiment 1.

Semiconductor module 100*a* according to Modification 1 is characterized by being configured to include supports 5 made of a metal material having a melting point different from that of binder 4.

With this configuration, since both of binder 4 and supports 5 are made of a metal material, heat can be dissipated from wiring substrate 2 to heat sink 3 via supports 5. Accordingly, it is possible to increase heat dissipation from semiconductor elements 1. Furthermore, by configuring binder 4 and supports 5 using different materials having different melting points, it is possible to selectively heat and melt one of the materials having the lower one of the melting points. For example, supports 5 may be made of a material having a melting point higher than that of the material of supports 5. In this way, it is possible to prevent supports 5 from re-melting when heating binder 4.

Modification 2 of Embodiment 1

Figure 3:
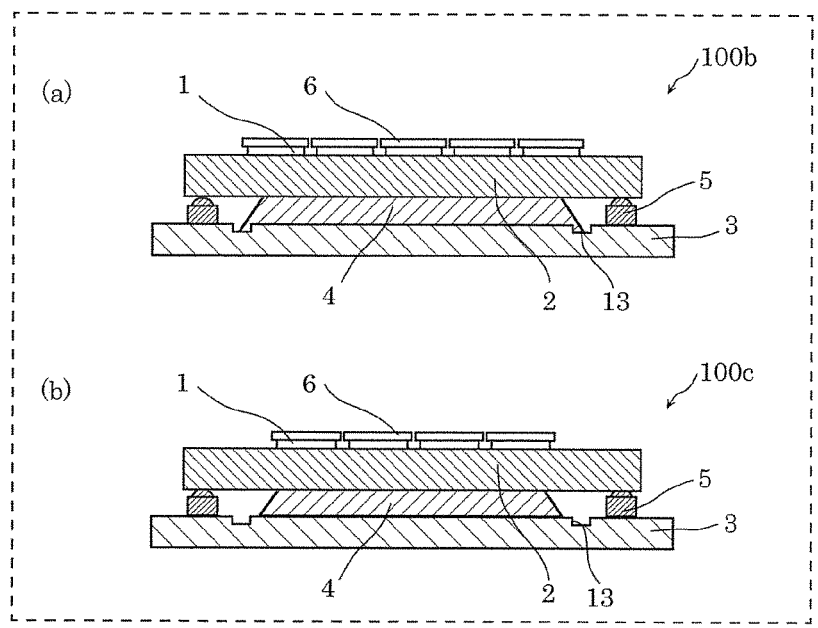
FIG. 3 shows cross-sectional views of Modification 2 of the semiconductor module according to Embodiment 1 and a variation of Modification 2.

FIG. 3 shows cross-sectional views of configurations of Modification 2 of semiconductor module 100 according to Embodiment 1 and a variation of Modification 2.

Semiconductor module 100b according to Modification 2 and semiconductor module 100c according to the variation of Modification 2 are characterized by being configured to have groove 13 between supports 5 and binder 4 in the surface facing wiring substrate 2 of heat sink 3. Although binder 4 is partly in groove 13 in semiconductor module 100b illustrated in (a) of FIG. 3, this configuration is not essential.

With this configuration, even when binder 4 is melted and spread when heat sink 3 and wiring substrate 2 are bonded, an extra portion is housed in groove 13 and is prevented from further spreading. Thus, it is possible to reduce contact between binder 4 and supports 5.

Here, as in the case of semiconductor module 100c illustrated in (b) of FIG. 3, it is also possible to form groove 13 and binder 4 apart from each other when binder 4 is significantly shrunk due to cooling down after the extra portion of binder 4 is housed in groove 13. In this case, it is possible to set presence/absence of contact of binder 4 with groove 13 as a reference for determining success or failure of separation between binder 4 and supports 5. This makes it possible to check the success or failure easily with X-rays or a transmission electron microscope.

Modification 3 of Embodiment 1

Figure 4:
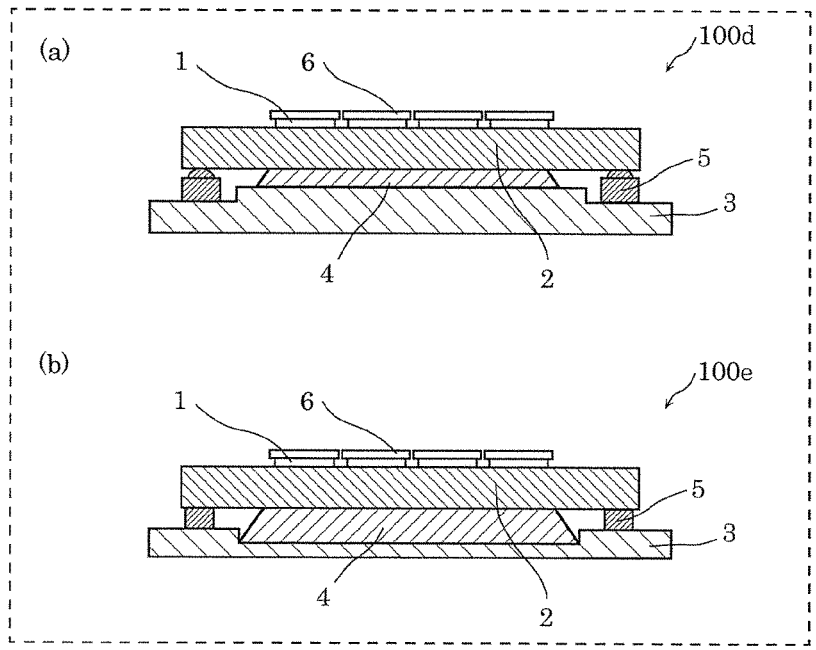
FIG. 4 shows cross-sectional views of Modification 3 of the semiconductor module according to Embodiment 1 and a variation of Modification 3.

FIG. 4 shows cross-sectional views of configurations of Modification 3 of semiconductor module 100 according to Embodiment 1 and a variation of Modification 2.

Semiconductor module 100d according to Modification 3 and semiconductor module 100e according to the variation of Modification 3 are characterized by being configured to have heat sink 3 whose thickness is different from part to part.

More specifically, in the case of semiconductor module 100d illustrated in (a) of FIG. 4, heat sink 3 is formed to be thicker at the part immediately below binder 4 than at the parts on which supports 5 are arranged.

In semiconductor module 100d, a large amount of heat is generated at the part immediately below the area in which a plurality of semiconductor elements 1 are mounted. By forming binder 4 to be partly thinner in this way, it is possible to increase heat dissipation to heat sink 3. In particular, heat dissipation is further increased by forming binder 4 to be thinner only at the part immediately below electrodes 8 of semiconductor elements 1 or to be thinner at the parts corresponding to the positions to electrodes 8.

In addition, the plating thickness of heat sink 3 etc. in semiconductor module 100d may be adjusted by changing only the thickness of die pad area 9 of heat sink 3, or only die pad area 9 may be plated. In any case, it is easier to make modifications and minor adjustments after designing semiconductor module 100d compared to change the thickness of heat sink 3.

In contrast to the case of semiconductor module 100d illustrated in (a) of FIG. 4, in semiconductor module 100e illustrated in (b) of FIG. 4, heat sink 3 is formed to be thinner at the part immediately below binder 4 than at the parts on which supports 5 are mounted. In this way, binder 4 itself is formed to be relatively thicker.

With this configuration, thick binder 4 absorbs the difference in line expansion between wiring substrate 2 and heat sink 3, and thereby reducing stress due to the difference in line expansion between wiring substrate 2 and heat sink 3. Accordingly, reliability in connecting wiring substrate 2 and heat sink 3 is increased.

Modification 4 of Embodiment 1

Figure 5:
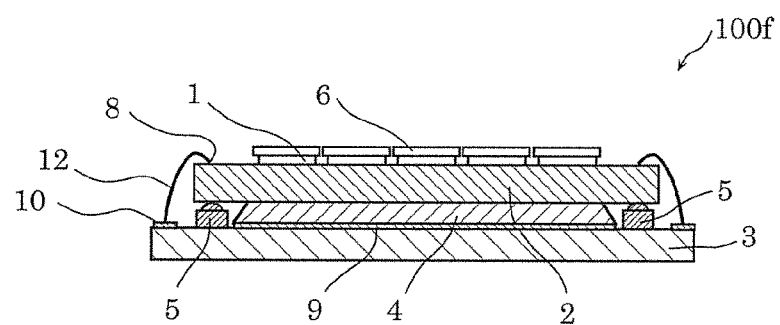
FIG. 5 is a cross-sectional view of Modification 4 of the semiconductor module according to Embodiment 1.

FIG. 5 is a schematic cross-sectional view of a configuration of Modification 4 of semiconductor module 100 according to this embodiment.

Semiconductor module 100f according to Modification 4 is characterized in that electrodes 8 on wiring substrate 2 on which semiconductor elements 1 are mounted and electrodes 10 on heat sink 3 are electrically connected by ribbon bonding or the like using a metal wire made of Cu, Au, Al, or the like, and that binder 4 is not electrically connected to any of semiconductor elements 1 and wiring substrate 2.

With this configuration, even when binder 4 is insulated from semiconductor elements 1 and wiring substrate 2, in semiconductor module 100f, semiconductor elements 1 and wiring substrate 2 are electrically connected to electrodes 8 and electrodes 10, respectively. In this way, semiconductor module 100f maintains electrical characteristics required as a semiconductor module irrespective of a bonding state of supports 5 and binder 4.

Here, it is desirable that supports 5 be arranged so that the positions of the centers of supports 5 are located immediately below electrodes 8 of wiring substrate 2. With this arrangement, supports 5 are located immediately below electrodes 8 of wiring substrate 2 when electrodes 8 of wiring substrate 2 and electrodes 10 of heat sink 3 are electrically connected using metal wire 12 after heat sink 3 is mounted on wiring substrate 2. This prevents wiring substrate 2 from deflecting in semiconductor module 100f, which stabilizes bonding therein.

Modification 5 of Embodiment 1

Figure 6:
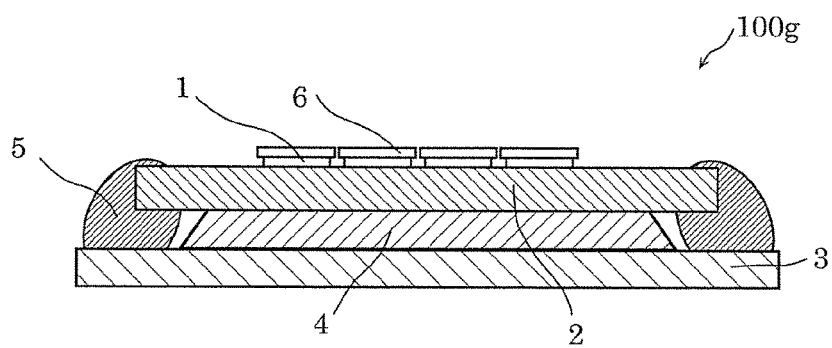
FIG. 6 is a cross-sectional view of Modification 5 of the semiconductor module according to Embodiment 1.

FIG. 6 is a schematic cross-sectional view of a configuration of Modification 5 of semiconductor module 100 according to Embodiment 1.

Semiconductor module 100g according to Modification 5 is characterized in that the top ends of supports 5 are located at positions higher than a first surface of wiring substrate 2 when seen from heat sink 3. More specifically, as illustrated in FIG. 6, supports 5 partly cover the lower surface, side surfaces, and corners of wiring substrate 2, or extend upward to partly cover the upper surface of wiring substrate 2.

With this configuration, in semiconductor module 100g, supports 5 fix wiring substrate 2 by extending upward to cover the side surfaces and further partly cover the upper surface of wiring substrate 2. This particularly makes it possible to minimize displacement and movement of heat sink 3 and wiring substrate 2 in the bonding thereof. This also reduces a risk that wiring substrate 2 is moved on heat sink 3 due to external force. Furthermore, by forming supports 5 so that the upper surfaces of supports 5 are substantially flush with the upper surfaces of semiconductor elements 1 including phosphors 6, an effect of preventing external light from entering semiconductor elements 1 is also provided.

In each of Embodiment 1, Modifications 1 to 5 of Embodiment 1, and the variations of Modifications 1 to 5, the plurality of supports 5 are formed to have an approximately equal height from the interface with heat sink 3. In this way, wiring substrate 2 mounted on heat sink 3 while being fixed by heat sink 3 and supports 5 is stably disposed substantially in parallel with heat sink 3.

Embodiment 2

Hereinafter, Embodiment 2 is described with reference to FIG. 7.

This embodiment describes a method for manufacturing semiconductor module 100 according to Embodiment 1 explained with reference to (a) of FIG. 1.

Figure 7:
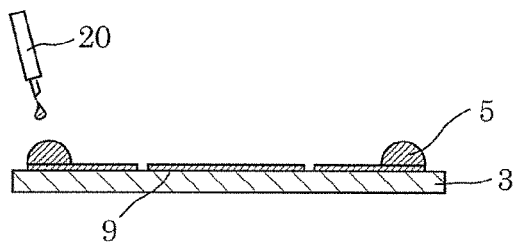
FIG. 7 shows cross-sectional views for explaining a semiconductor module manufacturing method according to Embodiment 2.
Figure 7:
Figure 7:
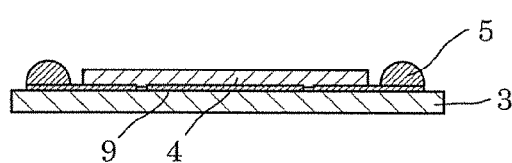
Figure 7:
Figure 7:
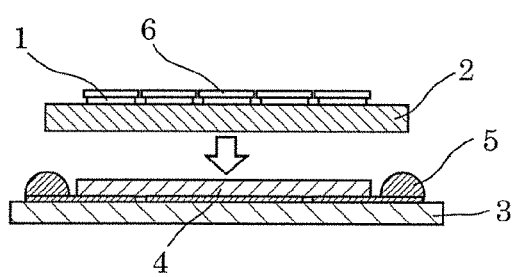
Figure 7:
Figure 7:
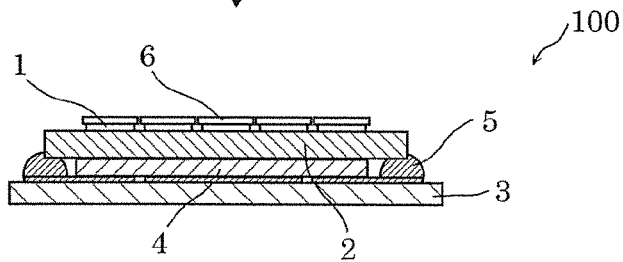

First, as illustrated in (a) of FIG. 7, supports 5 are mounted above predetermined areas at a peripheral part of heat sink 3. Here, supports 5 may be made of, for example, a resin material. A liquid resin material may be applied to heat sink 3 using dispenser 20.

Next, as illustrated in (b) of FIG. 7, heat sink 3 is heated on a not-shown stage. Subsequently, a metal pellet as binder 4 is mounted on die pad area 9, and is heated at a temperature below the melting point thereof for provisional bonding. In the case of an AuSn pellet for example, provisional bonding is performed at 250 degrees Celsius that is below the melting point thereof. Here, the metal pellet having a thickness of approximately 50 μm is used. During the provisional bonding, the metal pellet that is binder 4 maintains its initial height on heat sink 3. At this time, it is desirable that supports 5 be prevented from touching wiring substrate 2.

Next, as illustrated in (c) of FIG. 7, on the stage, wiring substrate 2 having semiconductor elements 1 mounted thereon is disposed by not-shown mounting head tool above heat sink 3 having binder 4 and supports 5 mounted thereon. Subsequently, wiring substrate 2 having semiconductor elements 1 mounted thereon is pressed in contact and bonded with heat sink 3 having binder 4 and supports 5 mounted thereon. Here, it is only necessary that supports 5 be transformed to be flush with the metal pellet that is binder 4. In other words, it is desirable that supports 5 be higher than binder 4 before wiring substrate 2 and heat sink 3 are bonded.

Next, as illustrated in (d) of FIG. 7, supports 5 and wiring substrate 2 are bonded in a heating process so that wiring substrate 2 can be provisionally fixed in alignment with the positions of supports 5. Here, the heating temperature is lower than a temperature at which the metal pellet that is binder 4 is provisionally bonded, and may be, for example, 230 degrees Celsius that is lower than 250 degrees Celsius in the case of the AuSu pellet. After the provisional fixing, the mounting head tool releases wiring substrate 2.

Subsequently, the pellet that is binder 4 is heated to the melting point or above to be melted, and then is cooled down to bond wiring substrate 2 and heat sink 3. For example, the AuSn pellet is heated at 300 degrees Celsius or above. In this way, semiconductor module 100 illustrated in (a) of FIG. 1 is completed.

Since supports 5 are used in this embodiment, supports 5 and wiring substrate 2 are bonded first in the heating process, and then wiring substrate 2 is provisionally fixed in alignment with the positions of supports 5. As a result, wiring substrate 2 and binder 4 can be bonded by performing the heating process which is a general heating process such as reflow heating. Thus, it is also possible to collectively bond a large number of such components using equipment exclusive for reflow heating. This increases process performance.

Modification 1 of Embodiment 2

Hereinafter, Modification 1 of Embodiment 2 is described with reference to FIG. 8.

Modification 1 describes a method for manufacturing semiconductor module 100a according to Modification 1 of Embodiment 1, explained with reference to FIG. 2.

Figure 8:
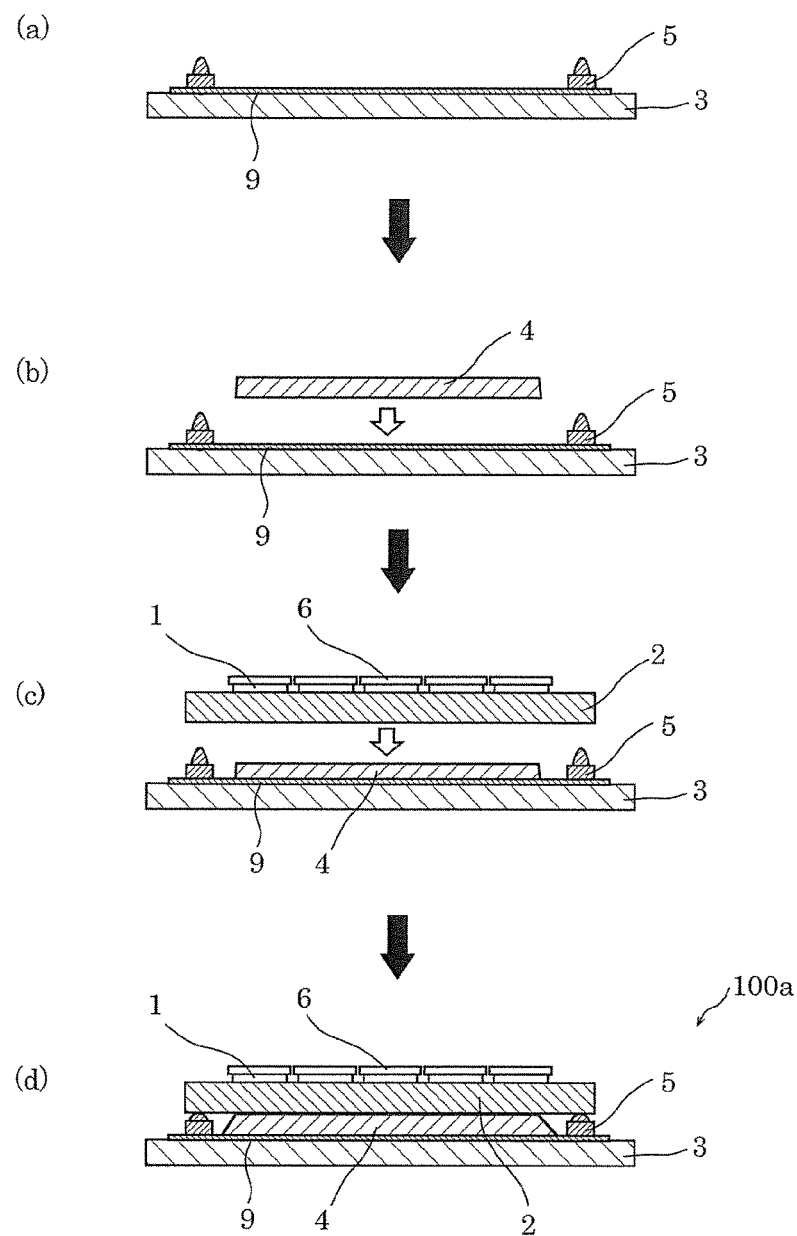
FIG. 8 shows cross-sectional views for explaining Modification 1 of the semiconductor module manufacturing method according to Embodiment 2.

First, as illustrated in (a) of FIG. 8, metal bumps which become supports 5 are bonded to electrodes 10 (not illustrated in FIG. 8) on heat sink 3 by ultrasonic bonding or heat-melting bonding. In ultrasonic bonding, bonding is accelerated by metal adhesion due to ultrasonic rather than temperature, and thus is possible at a low temperature. In the case of inter-Au bonding for example, Au and Au are fixed at 200 degrees Celsius or below.

Next, as illustrated in (b) of FIG. 8, binder 4 made of a metal pellet different from the metal pellet used to form supports 5 is mounted and heated on die pad area 9 of heat sink 3 in such a manner that binder 4 is prevented from touching supports 5. Here, binder 4 and heat sink 3 are bonded at a temperature below the melting point of binder 4, and are provisionally fixed in a semi-melted state. Materials for use as a material for binder 4 include not only metal pellets but also paste materials. The pellet materials are more suitable for the present manufacturing method because they shrink less after heating and cooling down.

In the case of using a paste material, flux is applied to the upper surface of the paste material after the paste material is mounted. A paste including metal balls having a diameter corresponding to a target height after bonding may be used. In this case, the height of the metal balls accurately determine the height of wiring substrate 2 with respect to heat sink 3 in the process in which weights are applied to binder 4 as described later, which makes it easier to control the height.

Next, as illustrated in (c) of FIG. 8, wiring substrate 2 having semiconductor elements 1 mounted thereon is made contact with supports 5 so that wiring substrate 2 presses supports 5 by using its weight to flatten supports 5. Here, binder 4 is heated at a temperature below the melting point thereof so as not to be melted.

Next, as illustrated in (d) of FIG. 8, semiconductor module 100a is completed by heating binder 4 to the melting point or above and then cooling down binder 4.

Since supports 5 are used in semiconductor module 100a according to this modification, supports 5 and wiring substrate 2 are bonded first in the heating process, and then wiring substrate 2 is provisionally fixed in alignment with the positions of supports 5. As a result, wiring substrate 2 and binder 4 can be bonded by performing the heating process which is a general heating process such as reflow heating. Thus, it is also possible to collectively bond a large number of such components using equipment exclusive for reflow heating. This increases process performance.

Modification 2 of Embodiment 2

Hereinafter, Modification 2 of Embodiment 2 is described with reference to FIG. 9.

Modification 2 describes a method for manufacturing semiconductor module 100b according to Modification 2 of Embodiment 1, explained with reference to FIG. 3.

The method for manufacturing semiconductor module 100b according to Modification 2 is similar to the manufacturing method described in Modification 1 with reference to FIG. 8, and thus only the differences from Modification 1 are described.

Figure 9:
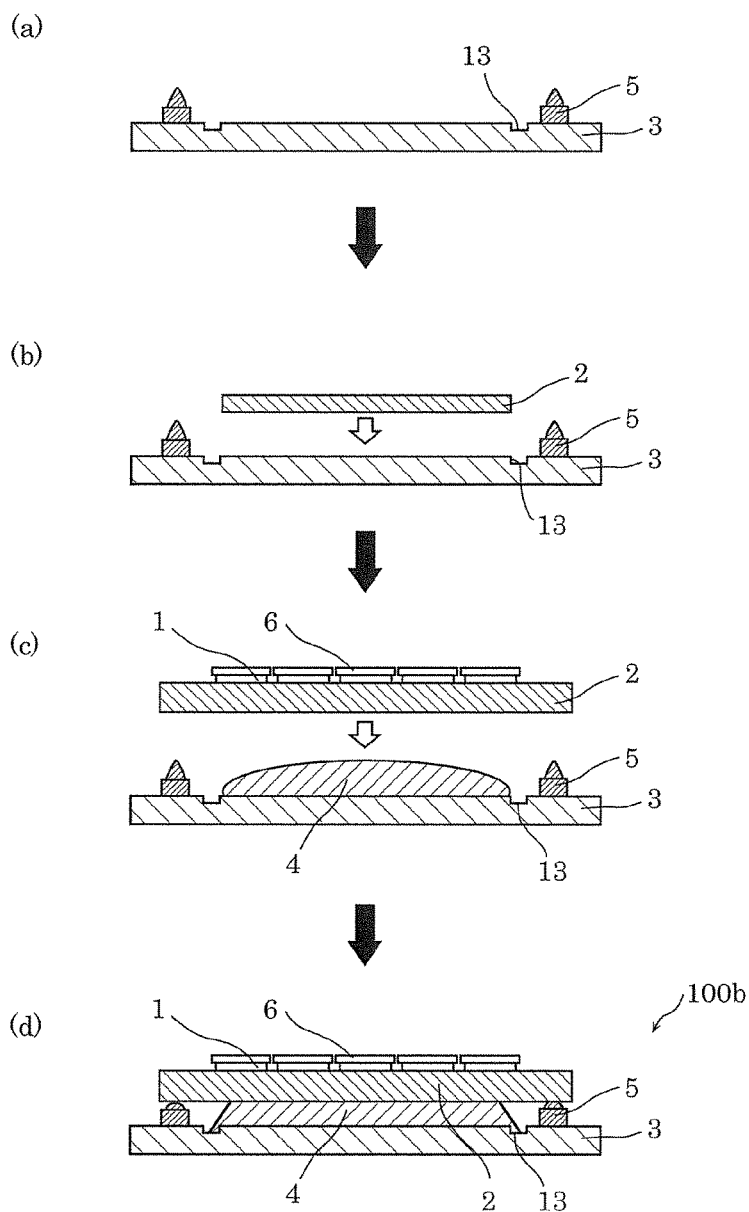
FIG. 9 shows cross-sectional views for explaining Modification 2 of the semiconductor module manufacturing method according to Embodiment 2.

The manufacturing method illustrated in (a) and (b) of FIG. 9 is similar to the manufacturing method illustrated in (a) and (b) of FIG. 8. As illustrated in (a) of FIG. 9, groove 13 is formed in heat sink 3 at parts between the area with supports formed therein and an area on which binder 4 is to be disposed in the process for forming supports 5 and the subsequent processes.

Next, as illustrated in (b) of FIG. 9, binder 4 made of a metal pellet different from the metal pellet used to form supports 5 is mounted and heated on die pad area 9 (not shown in FIG. 9) of heat sink 3 in such a manner that binder 4 is prevented from touching supports 5. Here, binder 4 and heat sink 3 are bonded at a temperature below the melting point of binder 4, and are provisionally fixed in a semi-melted state. Materials for use as a material for binder 4 include not only metal pellets but also paste materials. The pellet materials are more suitable for the present manufacturing method because they shrink less after heating and cooling down.

In the case of using a paste material, flux is applied to the upper surface of the paste material after the paste material is mounted. A paste including metal balls having a diameter corresponding to a target height after bonding may be used. In this case, the height of the metal balls accurately determine the height of wiring substrate 2 with respect to heat sink 3 in the process in which weights are applied to binder 4 as described later, which makes it easier to control the height.

Next, as illustrated in (c) of FIG. 9, wiring substrate 2 having semiconductor elements 1 mounted thereon is made contact with supports 5 so that wiring substrate 2 presses supports 5 by using its weight to flatten supports 5. Here, binder 4 is heated at a temperature corresponding to the melting point or above. In this case, even after binder 4 is melted, the extra portion of binder 4 is housed in groove 13 in the melting process and does not spread beyond groove 13. Thus, it is possible to prevent binder 4 from touching supports 5.

Since supports 5 are used in this modification, supports 5 and wiring substrate 2 are bonded first in the heating process, and then wiring substrate 2 is provisionally fixed in alignment with the positions of supports 5. As a result, wiring substrate 2 and binder 4 can be bonded by performing the heating process which is a general heating process such as reflow heating. Thus, it is also possible to collectively bond a large number of such components using equipment exclusive for reflow heating. This increases process performance.

Modification 3 of Embodiment 2

Hereinafter, Modification 3 of Embodiment 2 is described with reference to FIG. 10.

Modification 3 is a method for manufacturing semiconductor module 100h similar to semiconductor module 100g described in Modification 5 of Embodiment 1, with reference to FIG. 6.

A finished product of semiconductor module 100h manufactured according to Modification 3 differs from a finished product of semiconductor module 100g described with reference to FIG. 6 in that supports 5 partly cover the side surfaces of wiring substrate 2 but do not extend upward to partly cover the upper surface of wiring substrate 2.

Figure 10:
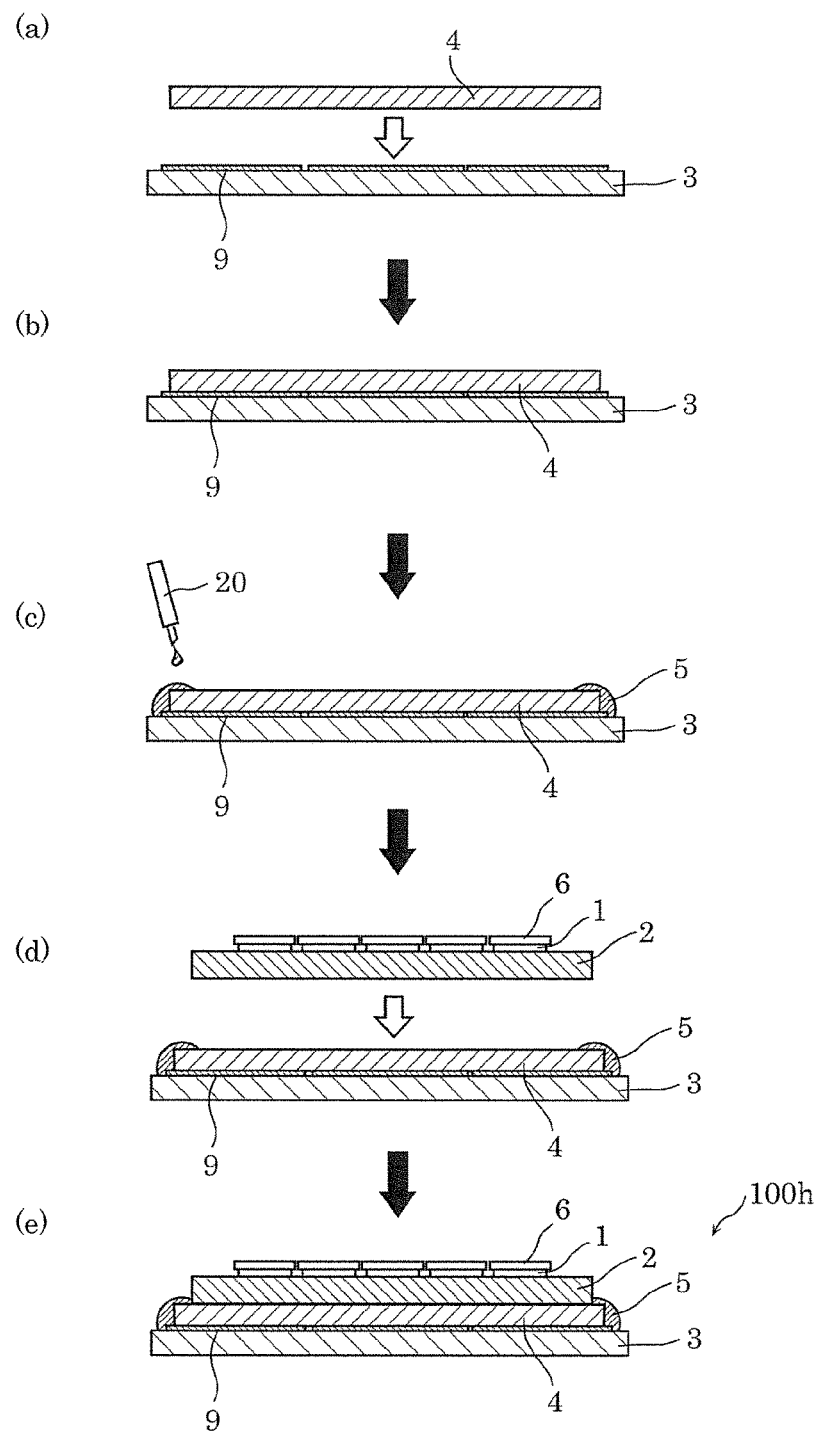
FIG. 10 shows cross-sectional views for explaining Modification 3 of the semiconductor module manufacturing method according to Embodiment 2.

First, as illustrated in (a) of FIG. 10, heat sink 3 is heated on a not-shown stage.

Next, as illustrated in (b) of FIG. 10, a metal pellet as binder 4 is mounted on die pad area 9 on heat sink 3, and is heated at a temperature below the melting point thereof for provisional bonding. In the case of an AuSn pellet for example, provisional bonding is performed at approximately 250 degrees Celsius that is the melting point thereof or below. The AuSn pellet may have a thickness of approximately 50 pm. During the provisional bonding, the metal pellet that is binder 4 maintains its initial height on heat sink 3.

Next, as illustrated in (c) of FIG. 10, supports 5 are mounted at peripheral parts of heat sink 3. In (c) of FIG. 10, supports 5 are made of a resin material. A liquid resin material is applied to heat sink 3 using dispenser 20. At this time, supports 5 are formed to cover only the peripheral parts of the side surfaces and the upper surface of binder 4. In this way, it is possible to prevent supports 5 from entering space between wiring substrate 2 and binder 4 and wet-spreading in the process for forming supports 5 and the subsequent processes.

Next, as illustrated in (d) of FIG. 10, on the stage, wiring substrate 2 having semiconductor elements 1 mounted thereon is disposed by not-shown mounting head tool above heat sink 3 having binder 4 and supports 5 mounted thereon.

Next, as illustrated in (e) of FIG. 10, wiring substrate 2 having semiconductor elements 1 mounted thereon is pressed in contact and bonded with heat sink 3 having binder 4 and supports 5 mounted thereon. At this time, in the heating process, the parts of supports 5 above the peripheral parts of the upper surface of binder 4 are bonded with wiring substrate 2, and are provisionally fixed in alignment with supports 5. Here, the heating temperature is lower than a temperature at which the metal pellet that is binder 4 is provisionally bonded, and may be, for example, 230 degrees Celsius that is lower than 250 degrees Celsius in the case of the AuSu pellet. After the provisional fixing, the mounting head tool releases wiring substrate 2.

Subsequently, the pellet that is binder 4 is heated to the melting point or above to be melted, and then is cooled down to bond wireless substrate 2 and heat sink 3. For example, the AuSn pellet is heated at 300 degrees Celsius or above. At this time, the parts of supports 5 in the vicinity of the side surfaces of wiring substrate 2 surround the side surfaces of wiring substrate 2 and solidify thereon. As a result, wiring substrate 2 is fully fixed by integrated support 5 surrounding the peripheral parts. In this way, semiconductor module 100h is completed.

Since supports 5 are used in this modification, supports 5 and wiring substrate 2 are bonded first in the heating process, and then wiring substrate 2 is provisionally fixed in alignment with the positions of supports 5. As a result, wiring substrate 2 and binder 4 can be bonded by performing the heating process which is a general heating process such as reflow heating. Thus, it is also possible to collectively bond a large number of such components using equipment exclusive for reflow heating. This increases process performance.

In Embodiment 2 and modifications thereof, binders 4 and supports 5 are formed in different orders. There is no problem if the formation order of binders 4 and supports 5 is changed as long as their arrangement relationship is maintained.

Hereinafter, common characteristics of Embodiment 1 and Embodiment 2 are described in comparison with conventional techniques.

Figure 11:
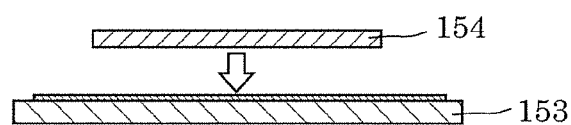
FIG. 11 shows cross-sectional views for explaining a method for manufacturing a semiconductor module according to a conventional technique.
Figure 11:
Figure 11:
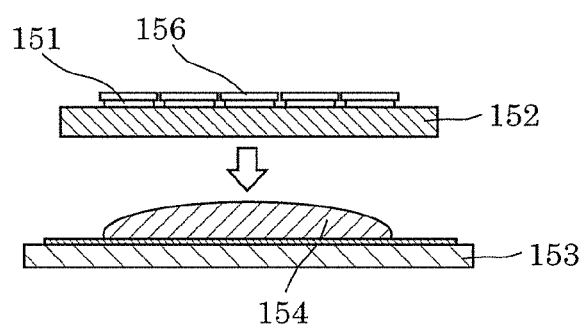
Figure 11:
Figure 11:
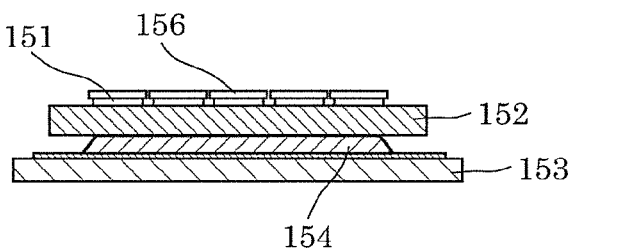

FIG. 11 illustrates a method for manufacturing semiconductor module 150 according to a conventional technique.

Semiconductor module 150 according to the conventional technique is manufactured by: mounting binder 154 on heat sink 153 as illustrated in (a) of FIG. 11; melting binder 154, and causing a not-shown mounting head tool to dispose wiring substrate 152 having semiconductor elements 151 mounted thereon above heat sink 153 with binder 154 as illustrated in (b) of FIG. 11; and pressing wiring substrate 152 having semiconductor elements 151 mounted thereon in contact with heat sink 153 with binder 154 so as to bond wiring substrate 152 to heat sink 153. Semiconductor module 150 is completed by cooling down binder 154 next as illustrated in (c) of FIG. 11.

In the conventional technique, it is necessary to dispose wiring substrate 152 having semiconductor elements 151 mounted thereon above heat sink 153 with binder 154, press wiring substrate 152 having semiconductor elements 151 mounted thereon in contact with heat sink 153 with binder 154 so as to bond wiring substrate 152 to heat sink 153, and cause the mounting head tool to hold wiring substrate 152 having semiconductor elements 151 mounted thereon until binder 154 is sufficiently cooled down.

In this embodiment, since supports 5 are used, supports 5 and wiring substrate 2 are bonded first in the heating process, and then wiring substrate 2 is provisionally fixed in alignment with the positions of supports 5. This provisional fixing makes it possible to perform highly-accurate control on the mounting accuracy (a height, a tilt, a swing, a position on the X-Y plane, etc. of wiring substrate 2 and semiconductor elements 1 with respect to heat sink 3.

In addition, there is no need to cause the mounting head tool to hold wiring substrate 2 after the provisional fixing. As a result, wiring substrate 2 and binder 4 can be bonded by performing the heating process which is a general heating process such as reflow heating. Thus, it is also possible to collectively bond a large number of such components using equipment exclusive for reflow heating. This increases process performance.

(Effects etc.)

A semiconductor module according to an aspect of the present disclosure includes: one or more semiconductor elements; a wiring substrate having a first surface on which the one or more semiconductor elements are mounted, the wiring substrate being electrically connected to the one or more semiconductor elements; a heat sink on which the wiring substrate is mounted, the heat sink facing a second surface of the wiring substrate on a reverse side of the first surface; a binder which is formed in a die pad area on the heat sink so as to be present between the wiring substrate and the heat sink, and bonds the wiring substrate and the heat sink; and a support which is formed in a peripheral part of the die pad area on the heat sink, and fixes the wiring substrate to the heat sink by being in contact with a peripheral part of the second surface of the wiring substrate.

With this configuration, the semiconductor module is capable of maintaining the state in which the wiring substrate and the heat sink are provisionally fixed by the support when the wiring substrate and the heat sink are bonded by the binder. In this way, it is possible to prevent the wiring substrate and the heat sink from being misaligned and displaced toward the Z direction caused due to the difference in line expansion rate between the materials thereof. Furthermore, the configuration obviates the need to cause a mounting head tool to hold the wiring substrate long time from mounting to cooling down as in the conventional technique, which reduces the manufacturing cycle time.

In addition, in the semiconductor module according to the aspect of the present disclosure, the support may comprise at least three supports formed independently, the at least three supports may have substantially the same height from the interface between the at least three supports and the heat sink, and the binder may be disposed to be surrounded by the at least three supports in a plan view.

With this configuration, the wiring substrate is stably fixed on the surface of the heat sink via the at least three supports. Thus, it is possible to reduce tilt and displacement on the X-Y plane of the one or more semiconductor elements and the wiring substrate with respect to the heat sink.

In addition, in the semiconductor module according to the aspect of the present disclosure, the binder may not be electrically connected to any of the one or more semiconductor elements and the wiring substrate.

With this configuration, even when the binder is insulated from the one or more semiconductor elements and the wiring substrate, the one or more semiconductor elements and the wiring substrate are electrically connected to electrodes (8) and electrodes (10), respectively. In this way, the semiconductor module is capable of maintaining electrical characteristics required as a semiconductor module irrespective of a bonding state of the support and the binder.

In addition, in the semiconductor module according to the aspect of the present disclosure, the heat sink may have a surface which faces the second surface of the wiring substrate, and the surface may have a groove formed between the support and the binder in a plan view, and in the groove, the binder is partly disposed.

With this configuration, even when the boding material is melted and spread when the heat sink and the wiring substrate are bonded, an extra portion is housed in the groove and is prevented from further spreading. Thus, it is possible to reduce contact between the binder and the support.

In addition, in the semiconductor module according to the aspect of the present disclosure, the binder may be made of a material containing a metal, the support may be made of a material containing a metal different from the metal contained in the material of the binder, and the support may have a melting point higher than a melting point of the binder.

With this configuration, since the binder and the support are each made of a metal material, heat can be dissipated from the wiring substrate to the heat sink via the support. In this way, it is possible to prevent the support from re-melting when heating the binder.

In addition, in the semiconductor module according to the aspect of the present disclosure, the support may be made of a resin material.

With this configuration, the heat sink and the wiring substrate can be insulated from each other.

In addition, in the semiconductor module according to the aspect of the present disclosure, the support may cover at least part of a side surface of the wiring substrate.

With this configuration, in the manufacturing process after the formation of the support, it is possible to prevent the support from entering space between the wiring substrate and the binder and wet-spreading.

In addition, in the semiconductor module according to the aspect of the present disclosure, an uppermost end of the support may be located higher than the first surface of the wiring substrate when seen from the heat sink.

With this configuration, the support fixes the wiring substrate by extending upward to cover the side surfaces and further partly cover the upper surface of the wiring substrate. This particularly makes it possible to minimize displacement and movement of the heat sink and the wiring substrate in the bonding thereof. This also reduces a risk that the wiring substrate is moved on the heat sink due to external force. Furthermore, by forming the support so that the upper surface of the support is substantially flush with the upper surfaces of the one or more semiconductor elements including phosphors, an effect of preventing external light from entering the one or more semiconductor elements is provided.

In addition, in the semiconductor module according to the aspect of the present disclosure, the binder may have a linear expansion coefficient which is between a linear expansion coefficient of the wiring substrate and a linear expansion coefficient of the heat sink.

With this configuration, the binder absorbs the difference in heat expansion rate between the wiring substrate and the heat sink, and thereby maintaining the reliability in the bonding of the wiring substrate and the heat sink.

In addition, a semiconductor module manufacturing method according to an aspect of the present disclosure is a semiconductor module manufacturing method including: forming at least three supports independently on a heat sink; forming a binder on the heat sink so that the binder does not touch the at least three supports; disposing a wiring substrate on which one or more semiconductor elements are mounted so that the binder is present between the wiring substrate and the heat sink and across the at least three supports, and fixing the wiring substrate to the at least three supports; and heating and melting the binder to bond the wiring substrate and the heat sink, wherein, in the forming of a binder, the binder is disposed to be surrounded by the at least three supports in a plan view.

With this configuration, since the at least three supports are used, the at least three supports and the wiring substrate are bonded first in the heating process, and then the wiring substrate is provisionally fixed in alignment with the positions of the at least three supports. This provisional fixing makes it possible to perform highly-accurate control on the mounting accuracy (a height, a tilt, a swing, a position on the X-Y plane, etc. of the wiring substrate and the one or more semiconductor elements with respect to the heat sink.

In addition, in the semiconductor module manufacturing method according to the aspect of the present disclosure, the binder may be made of a material containing a metal, and in the forming of a binder, the binder may be formed by heating and melting the material containing the metal.

With this configuration, heat can be dissipated from the wiring substrate to the heat sink via the binder.

In addition, in the semiconductor module manufacturing method according to the aspect of the present disclosure, the support may be made of a resin material.

With this configuration, the heat sink and the wiring substrate can be insulated from each other.

In addition, in the semiconductor module manufacturing method according to the aspect of the present disclosure, in the disposing and fixing of a wiring substrate, the resin material may be formed to cover at least a part of a side surface of the wiring substrate.

With this configuration, in the manufacturing process after the formation of the support, it is possible to prevent the support from entering space between the wiring substrate and the binder and wet-spreading.

In addition, in the semiconductor module manufacturing method according to the aspect of the present disclosure, the support may be made of a material containing a metal different from the metal contained in the material of the binder, and the support may have a melting point higher than a melting point of the binder.

Although the semiconductor modules and the methods for manufacturing the semiconductor modules according to aspects of the present disclosure have been described above based on the embodiments, modifications, and variations, the present disclosure is not limited to the embodiments, modifications, and variations. Embodiments etc. that a person skilled in the art may arrive at by adding various kinds of modifications to the above embodiments etc. or by arbitrarily combining some of the constituent elements in the embodiments etc. may be included in the aspects of the present disclosure without deviating from the scope of the present disclosure.

INDUSTRIAL APPLICABILITY

The present disclosure is useful for head lamps with LEDs and luminaires which provide high optical accuracy.

What is claimed is:

1. A semiconductor module, comprising:
one or more semiconductor elements;
a wiring substrate having a first surface on which the one or more semiconductor elements are mounted, the wiring substrate being electrically connected to the one or more semiconductor elements;
a heat sink on which the wiring substrate is mounted, the heat sink facing a second surface of the wiring substrate on a reverse side of the first surface;
a binder which is formed in a die pad area on the heat sink so as to be present between the wiring substrate and the heat sink, and bonds the wiring substrate and the heat sink; and
a support which is formed in a peripheral part of the die pad area on the heat sink, and fixes the wiring substrate to the heat sink by being in contact with a peripheral part of the second surface of the wiring substrate;
wherein the binder and the support are formed apart from each other,
the binder is made of a material containing a metal,
the support is made of a material containing a metal different from the metal contained in the material of the binder, and
the support has a melting point higher than a melting point of the binder.

2. The semiconductor module according to claim 1,
wherein the support comprises at least three supports formed independently,
the at least three supports have substantially the same height from an interface between the at least three supports and the heat sink, and
the binder is disposed to be surrounded by the at least three supports in a plan view.

3. The semiconductor module according to claim 1,
wherein the binder is not electrically connected to any of the one or more semiconductor elements and the wiring substrate.

4. The semiconductor module according to claim 1,
wherein the heat sink has a surface which faces the second surface of the wiring substrate, and the surface has a groove formed between the support and the binder in a plan view, and
in the groove, the binder is partly disposed.

5. A semiconductor module, comprising:
one or more semiconductor elements;
a wiring substrate having a first surface on which the one or more semiconductor elements are mounted, the wiring substrate being electrically connected to the one or more semiconductor elements;
a heat sink on which the wiring substrate is mounted, the heat sink facing a second surface of the wiring substrate on a reverse side of the first surface;
a binder which is formed in a die pad area on the heat sink so as to be present between the wiring substrate and the heat sink, and bonds the wiring substrate and the heat sink; and
a support which is formed in a peripheral part of the die pad area on the heat sink, and fixes the wiring substrate to the heat sink by being in contact with a peripheral part of the second surface of the wiring substrate;
wherein the binder and the support are formed apart from each other, and
the support is made of a resin material.

6. The semiconductor module according to claim 1, wherein the binder has a linear expansion coefficient which is between a linear expansion coefficient of the wiring substrate and a linear expansion coefficient of the heat sink.

7. A semiconductor module, comprising:
one or more semiconductor elements;
a wiring substrate having a first surface on which the one or more semiconductor elements are mounted, the wiring substrate being electrically connected to the one or more semiconductor elements;
a heat sink on which the wiring substrate is mounted, the heat sink facing a second surface of the wiring substrate on a reverse side of the first surface;
a binder which is formed in a die pad area on the heat sink so as to be present between the wiring substrate and the heat sink, and bonds the wiring substrate and the heat sink; and
a support which is formed in a peripheral part of the die pad area on the heat sink, and fixes the wiring substrate to the heat sink by being in contact with a peripheral part of the second surface of the wiring substrate,
wherein the support is made of a resin material, and
the support covers at least part of a side surface of the wiring substrate.

8. The semiconductor module according to claim 7,
wherein the support comprises at least three supports formed independently,
the at least three supports have substantially the same height from an interface between the at least three supports and the heat sink, and
the binder is disposed to be surrounded by the at least three supports in a plan view.

9. The semiconductor module according to claim 7, wherein the binder is not electrically connected to any of the one or more semiconductor elements and the wiring substrate.

10. The semiconductor module according to claim 7,
wherein the heat sink has a surface which faces the second surface of the wiring substrate, and the surface has a groove formed between the support and the binder in a plan view, and
in the groove, the binder is partly disposed.

11. The semiconductor module according to claim 7, wherein an uppermost end of the support is located higher than the first surface of the wiring substrate when seen from the heat sink.

12. The semiconductor module according to claim 7, wherein the binder has a linear expansion coefficient which is between a linear expansion coefficient of the wiring substrate and a linear expansion coefficient of the heat sink.

13. A semiconductor module manufacturing method, comprising:
forming at least three supports independently on a heat sink;
forming a binder on the heat sink so that the binder does not touch the at least three supports;
disposing a wiring substrate on which one or more semiconductor elements are mounted so that the binder is present between the wiring substrate and the heat sink and across the at least three supports, and fixing the wiring substrate to the at least three supports; and
heating and melting the binder to bond the wiring substrate and the heat sink,
wherein, in the forming of a binder, the binder is disposed to be surrounded by the at least three supports in a plan view.

14. The semiconductor module manufacturing method according to claim 13,
wherein the binder is made of a material containing a metal, and
in the forming of a binder, the binder is formed by heating and melting the material containing the metal.

15. The semiconductor module manufacturing method according to claim 13, wherein the support is made of a resin material.

16. The semiconductor module manufacturing method according to claim 15, wherein, in the disposing and fixing of a wiring substrate, the resin material is formed to cover at least a part of a side surface of the wiring substrate.

17. The semiconductor module manufacturing method according to claim 14,
wherein the support is made of a material containing a metal different from the metal contained in the material of the binder, and
the support has a melting point higher than a melting point of the binder.

18. The semiconductor module according to claim 5,
wherein the support comprises at least three supports formed independently,
the at least three supports have substantially the same height from an interface between the at least three supports and the heat sink, and
the binder is disposed to be surrounded by the at least three supports in a plan view.

19. The semiconductor module according to claim 5, wherein the binder is not electrically connected to any of the one or more semiconductor elements and the wiring substrate.

20. The semiconductor module according to claim 5,
wherein the heat sink has a surface which faces the second surface of the wiring substrate, and the surface has a groove formed between the support and the binder in a plan view, and
in the groove, the binder is partly disposed.

21. The semiconductor module according to claim 5, wherein the binder has a linear expansion coefficient which is between a linear expansion coefficient of the wiring substrate and a linear expansion coefficient of the heat sink.

* * * * *